United States Patent [19]
Rivera

[11] Patent Number: 5,814,752
[45] Date of Patent: Sep. 29, 1998

[54] MUSICAL INSTRUMENT CROSSOVER CIRCUITS AND METHOD OF USING SAME

[76] Inventor: Paul E. Rivera, 10230 Fairgrove Ave., Tujunga, Calif. 91042

[21] Appl. No.: 782,304

[22] Filed: Jan. 15, 1997

[51] Int. Cl.$^6$ .............................. G10H 1/46; H03F 3/68; H03G 5/00

[52] U.S. Cl. ........................... 84/711; 84/741; 84/DIG. 1; 84/DIG. 9; 330/126; 330/132; 381/118; 381/120

[58] Field of Search .............................. 84/622–633, 661, 84/665, 699, 700, 711, 723–736, 741, DIG. 1, DIG. 9; 330/124 R–142; 381/28, 118, 120, 121

[56] References Cited

U.S. PATENT DOCUMENTS

| | | | |
|---|---|---|---|
| 3,429,976 | 2/1969 | Tomcik ...................................... | 84/730 |
| 3,493,669 | 2/1970 | Elbrecht et al. ........................ | 84/736 X |
| 4,080,861 | 3/1978 | Wholahan ............................. | 84/DIG. 1 |
| 4,189,971 | 2/1980 | Mantani ................................ | 84/DIG. 1 |
| 4,819,537 | 4/1989 | Hayes et al. ........................... | 84/DIG. 9 |
| 5,086,686 | 2/1992 | Misawa et al. ........................ | 84/DIG. 1 |
| 5,543,579 | 8/1996 | Morinaga et al. ..................... | 84/DIG. 1 |

*Primary Examiner*—Stanley J. Witkowski
*Attorney, Agent, or Firm*—Potthast & Ring

[57] ABSTRACT

A musical instrument amplifier system (FIGS. 1 and 2) with a frequency selective crossover circuit (10) using passive band pass filters (36, 44) to separate the amplified signals from the power amplifier (14) of an amplifier system (12) into low frequency signals on an output connector (42) for a specially adapted bass audio speaker (38) while the higher frequency signals are applied to another speaker (46). The crossover circuit (10) is selectively connected with the normal speaker output (24) in lieu of the speaker (38) to add frequency crossover capability to any amplifier system. In another musical instrument amplifying system (88), the crossover circuit (FIG. 4, 122, 124, 130, 132) is internal to an amplifier system (90) and produces preamplified low frequency signals on a special output terminal (102) for power amplification by an external power amplifier (94) while the preselected low frequency signals are blocked from the internal power amplifier (118) so it produces only the relatively middle and high frequencies at the normal speaker output connector (98). The preselected low frequency signals bypass a special effects section (112) so that special effects is selectively only produced by the internal power amplifier (118) in the relatively middle and high frequency range, while the power of the external bass power amplifier (94) is separately adjustable from the adjustment to the power level of the internal power amplifier (118). When the external power amplifier is disconnected, the internal high pass filter (124) blocking low frequency signals to the internal power amplifier (118) is automatically removed to allow full frequency amplification by the internal power amplifier (118).

21 Claims, 4 Drawing Sheets

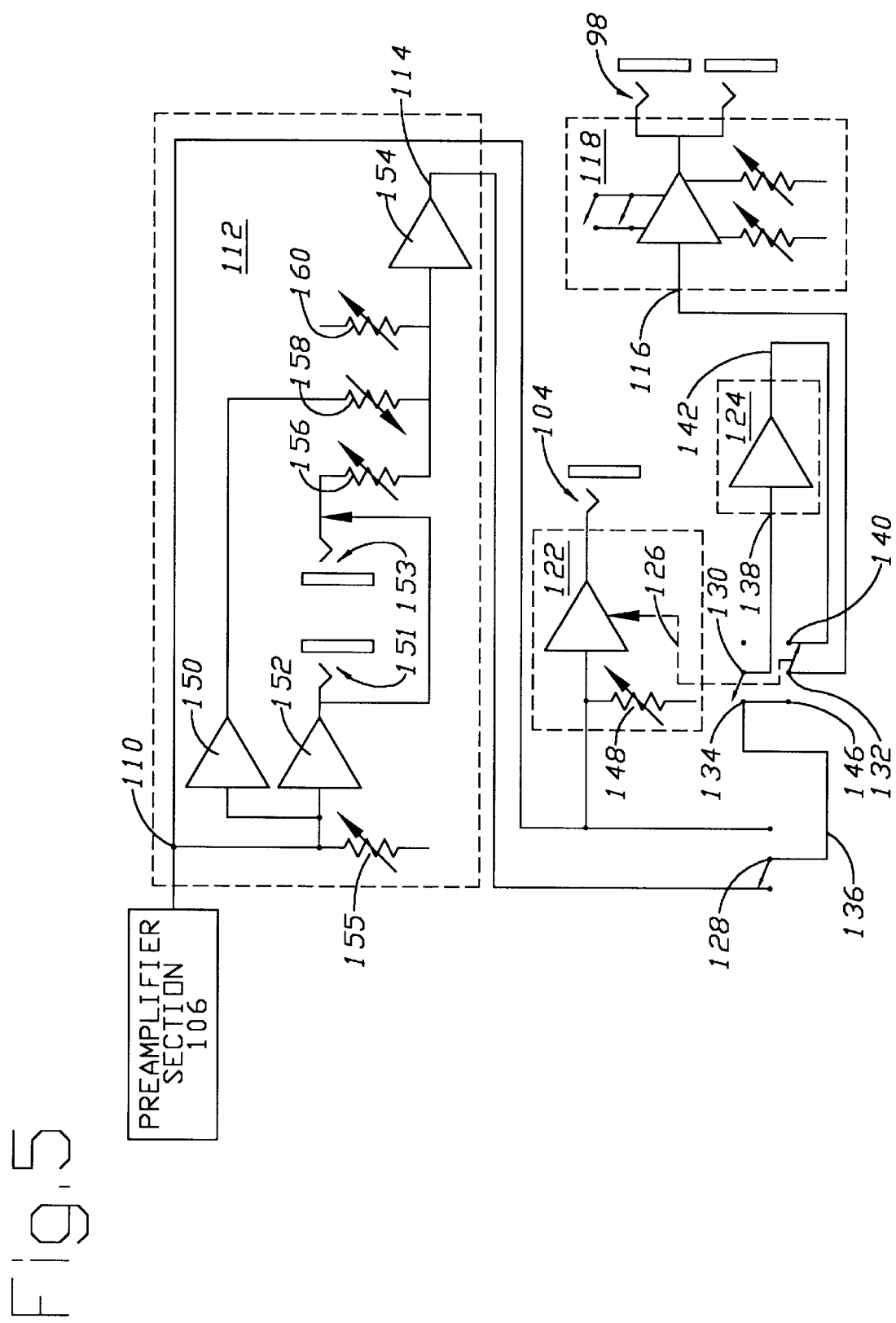

5,814,752

MUSICAL INSTRUMENT CROSSOVER CIRCUITS AND METHOD OF USING SAME

BACKGROUND OF THE INVENTION

1. Field of the Invention

This invention relates generally to musical instrument amplifying systems and particularly to apparatus and methods for special amplification and reproduction of signals of different frequency range.

2. Description of the Related Art Including Information Disclosed Under 37 C.F.R. 1.97–1.99

Musical instrument amplification systems are often used in open air or other large concert setting in which large power amplification is required to achieve the desired volume effect throughout the audience. Unlike common audio amplifiers which do not require these high power levels, it is common practice to utilize different speakers or speaker arrays for the different frequency ranges. Specifically, at high power levels many speakers are not equipped to accurately reproduce without excessive distortion bass, or relatively low, frequencies. On the other hand, in smaller settings, when less speaker output power is required, especially at lower frequencies, regular broad band speakers are sufficient and there is no need and, sometimes no space, for special bass speakers.

Known musical instrument amplifier systems lack the flexibility to enable optimal use of a base unit amplifier to function both in a high power mode in which special power amplification and speakers are needed for the relatively low frequency musical instrument signals and when such high power is not required. Known systems either require separate bass and mid-high speakers driven by separate power amplifiers or they only have one speaker drive output for all frequencies.

Moreover, when the regular amplifiers are employed by musicians, particularly guitar players, at high power levels, the amplifiers can distort at low frequencies, and this distortion is aggravated by the inability of speakers to simultaneously reproduce all the different frequency signals presented by the full range of frequencies. Power levels for the low frequency signals cannot be separately controlled.

SUMMARY OF THE INVENTION

The principal object of the present invention is to provide a musical instrument system and methods of using same which overcome the inflexibility and other disadvantages of known musical instrument amplifier systems by selectively providing for separate sound reproduction of relatively low and relatively high frequency signals.

This object is achieved in part through provision of an external musical instrument crossover circuit for use with a musical instrument amplifier system having an internal amplifier circuit with an input connector releasably connectable with an electrical signal generating musical instrument and an output connected to an output connector for releasable connection with an acoustic speaker with a first filter circuit including an input connectable with the output connector of the internal amplifier circuit and a first output connector for connection with an acoustic speaker, a first frequency band pass filter for passing substantially only musical instrument signals at the input of the first filter circuit having a first preselected frequency range to the first filter circuit output connector, and with a second filter circuit. The second filter circuit includes an input connectable with the output connector of the internal amplifier circuit, a second output connector for connection with an acoustic speaker and a second frequency pass filter for passing substantially only musical instrument signals at the input of the second filter circuit having a second preselected filter frequency range different from the first preselected frequency range to the second filter circuit output connector.

In the preferred embodiment, the musical instrument crossover circuit includes a first acoustic speaker connected to the first output connector specially adapted for being driven by amplified musical instrument signals of said first frequency range passed by the first filter circuit and a second acoustic speaker connected to the second output connector specially adapted for being driven by amplified musical instrument signals of the second frequency range passed by the second filter circuit.

Also, the object of the invention is partly obtained by providing a method of selectively amplifying musical instrument signals comprising the steps of (1) producing power amplified signals of signals of all frequencies on a speaker output connector of a base unit amplifier, (2) when normal operation is desired, selectively connecting the speaker output connector to a regular speaker to reproduce the amplified musical instrument signals of all frequencies and (3) when large bass frequency amplification is desired, selectively connecting the output connector to a crossover circuit to separate the power amplified musical instrument signals into relatively low and relatively high frequency signals components, connecting the relatively low frequency component signal to a bass speaker especially adapted to reproduce relatively low frequency signals and connecting the relatively high frequency component input to another speaker.

The object of the invention is additionally achieved by providing a musical instrument amplifying system having an internal power amplifier circuit with an input and an output, an input connector for releasable connection with an output cable of the musical instrument carrying musical instrument signals having different frequencies, and an output terminal for connection of the output of the internal power amplifier with an audio speaker, with a frequency selective crossover circuit, comprising a special output terminal, means selectively blocking from the input of the internal amplifier musical instruments signals of only a preselected frequency range, the musical instrument signals of frequency outside said preselected frequency range being provided to the internal power amplifier for amplification, and means for passing to the special output terminal musical instrument signals of a frequency within the preselected frequency range blocked from the input of the internal amplifier by said selective blocking means. In the preferred embodiment the preselected frequency range is the base range, the signals at the special output terminal are amplified by a power amplifier especially adapted for this frequency range and bass speakers especially adapted for the preselected frequency ranges are employed. The signals amplified by the internal power amplifier are selectively special effects processed and drive special or broad band speakers. The external power amplifier on the other hand is free from special effects but is capable of independent volume control.

Obtainment of the object is also achieved by provision of a method of selectively amplifying musical instrument signals comprising the steps of (1) employing a base amplifier unit with an internal power amplifier for amplifying musical instrument signals of the full frequency range at a regular speaker output connector and for producing preamplified musical instrument signals of only a preselected frequency range at a special output connector, (2) connecting an external power amplifier to the special output connector for power amplifying the preamplified musical instrument signals of the only preselected frequency range and (3) selectively blocking musical instrument signals within the preselected frequency range from being amplified by the internal power amplifier.

BRIEF DESCRIPTION OF THE DRAWINGS

The foregoing objects and advantageous features of the invention will be explained in greater detail and others will be made apparent from the detailed description of the preferred embodiment of the present invention which is given with reference to the several figures of the drawing, in which:

FIG. 5 is a circuit schematic of the high pass filter, the low pass filter, the switches for selectively applying the high pass filter to the internal power amplifier and the special effects functional blocks of FIG. 4.

DESCRIPTION OF THE PREFERRED EMBODIMENT

Figure 1:
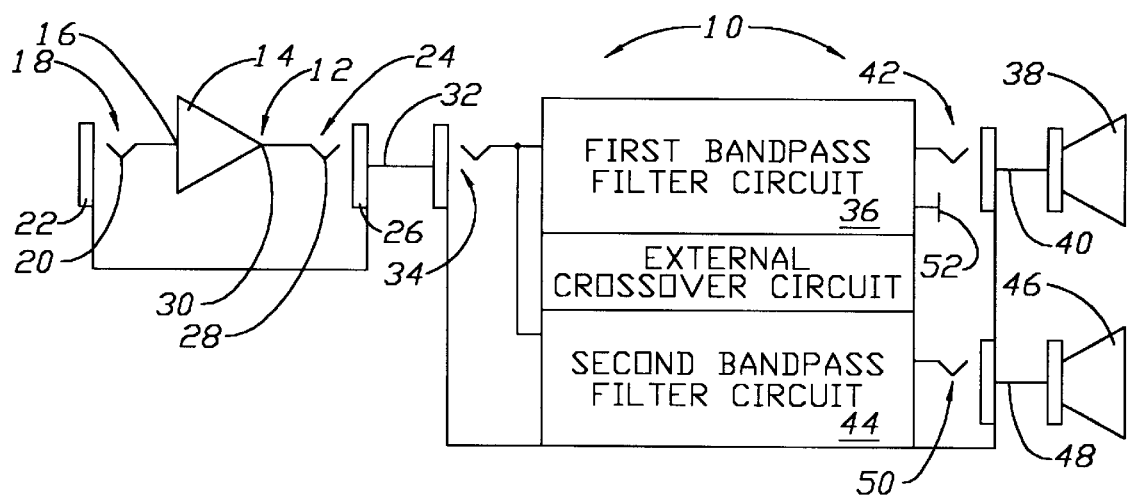
FIG. 1 is a partial schematic, partial functional block diagram of the external form of the musical instrument crossover circuit of the present invention.
Figure 2:
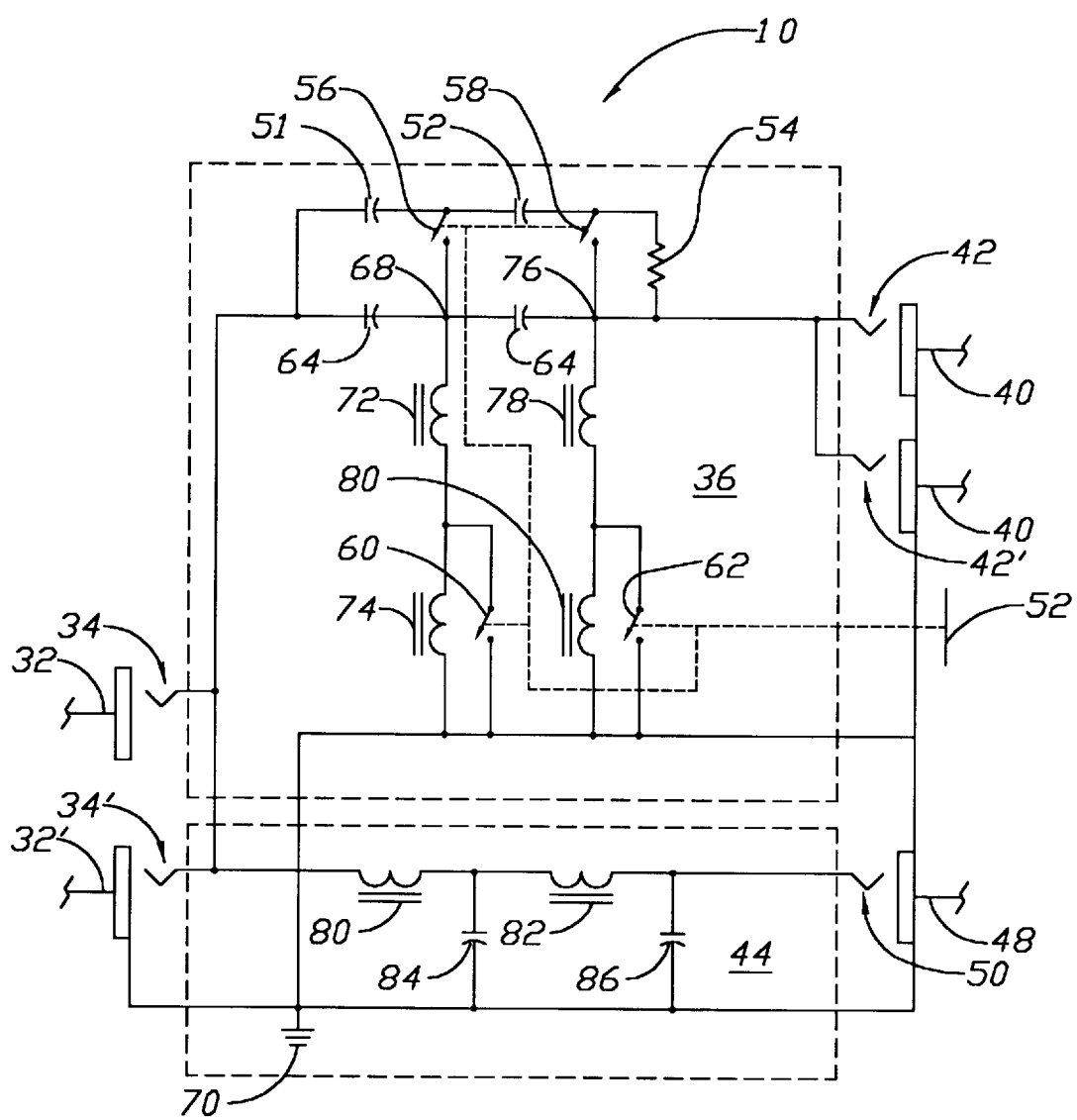
FIG. 2 is a circuit schematic of the first band pass filter circuit and the second band pass filter circuit of FIG. 1.

Referring to FIGS. 1 and 2, a functional block diagram of first form of the musical instrument crossover system 10 is shown being used in conjunction with an amplifier system 12 having an internal amplifier circuit 14 with an input 16 releasably connectable with an electrical signal generating musical instrument, such as an electric guitar, keyboard or the like (not shown) by means of a commercial cable 17 releasable connector, preferably a standard electrical connector jack receptacle 18 having a tip connector 20 and a grounded sleeve connector 22. A two wire coaxial cable jack (not shown) coupled with the musical instrument (not shown) and carrying musical instrument signals having a full range of frequencies, an outer cable component connected to the sleeve connector 22 while a tip of the jack which is isolated from the outer cable component connects with the tip connector 20 when the jack is fully inserted into the sleeve connector 22. An output jack receptacle connector 24 has a sleeve connector 26 and a tip connector 28 for connection of the output 30 of amplifier circuit with an audio speaker via a coaxial cable 32.

It should be appreciated that the amplifier system 12 is only schematically represented and, in fact, has many more circuits and other conventional elements in addition to the internal power amplifier 14 which have not been shown for purposes of simplicity sake, such as preamplifiers, filters, volume controls, special effects, base, etc. The amplifier system 12 is merely an abstract illustration of any musical instrument amplifier and those additional details form no part of the present invention.

In practicing the method of the present invention, instead of cable 32 being used to connect the speaker output terminal 24 to a single audio speaker which is required to respond to the full frequency range of the amplified musical instruments signals appearing on cable 32, it or another like cable is used to make connection with an input jack receptacle 34 of the external musical instrument crossover system 10.

The external crossover system 10 includes a first band pass filter circuit 36 interposed between the input jack receptacle 34 and a first audio speaker 38. The speaker 38 is releasably connected through a coaxial cable 40 and a first output connector jack receptacle 42. Preferably, the first audio speaker 38 is especially adapted to reproduce musical instrument signals in a first frequency range passed by the first band pass filter circuit 36. The external crossover system 10 also includes a second band pass filter circuit 44 interposed between the input jack receptacle 34 and a second audio speaker 46. The speaker 46 is releasably connected through a coaxial cable 48 and a second output connector jack receptacle 50. Preferably, the speaker 46 especially adapted to reproduce musical instrument signals in a second frequency range passed by the second band pass filter circuit 44 which is different from the frequency range passed by the first band pass filter circuit 36.

The first band pass filter circuit 44 also includes a selective impedance matching circuit having an external manually actuatable output impedance selection switch actuator 52. When the impedance selection switch actuator 52 is placed in one position, the output impedance appearing at the first output connector receptacle 42 is eight ohms, and when the output impedance switch is in another opposite position, the output impedance seen by speaker 38 is sixteen ohms.

Preferably, both of the first band pass filter circuit 36 and the second band pass filter circuit 44 are passive filters which do not employ amplifiers or other active devices, as illustrated by the preferred embodiment of the external crossover system 10 shown in FIG. 2. Alternatively, if additional amplification or impedance switching through use of active elements is desired, such amplification is employed.

Referring to FIG. 2, in the preferred embodiment of the external crossover system 10, the first band pass filter circuit 36 passes musical instrument signals of relatively middle and high frequencies, generally between 15 KHz and 150 KHz to output connector 42 for connection to acoustic speakers having an especially good linear response to signals having frequencies in this frequency range passed by the first band pass filter circuit 36. Likewise, the second band pass filter circuit 44 passes amplified musical instrument signals of relatively low frequencies, generally between 32 Hz and 150 Hz.

The first band pass filter circuit 36 includes a 32-microfarad capacitor 51, a 62-microfarad capacitor 52 and a 220 ohm resistor 54 connected in series between the input connector 34 and the output connector 42. The switch actuator 52 controls four switches 56, 58, 60 and 62. When all switches 56, 58, 60 and 62 are in the open position, as shown, the speaker 38 of FIG. 1 sees a relative high impedance of 16 ohms. In that event, a 32-microfarad capacitor 64 and a 62-microfarad capacitor 66 are connected in series with each other across, or in parallel with, the series circuit of capacitor 50, capacitor 52 and resistor 54 between the input connector 34 and output connector 42. The juncture 68 between capacitors 64 and 66 is connected to common, or ground, 70 via a series connection of a pair of 5.95-milihenry inductors 72 and 74. A juncture 76 between the capacitor 66 and resistor 54 is likewise connected through a series connection of two 17.34-milihenry inductors 78 and 80 to ground reference 70.

When the switch actuator 52 places the switches 56, 58, 60 and 62 in a closed portion, opposite to that shown in FIG. 2, the output impedances at the output connector 42 is reduced to eight ohms. In that event, capacitors 50 and 64 are placed in parallel, capacitors 52 and 66 are placed in parallel, and the parallel connections of capacitors 50 and 64, and 52 and 66, are connected in series with the resistor 54 between the input connector 34 and the output connector 42. The inductors 74 and 80 are removed from the circuit, or bypassed, and only inductors 72 and 78 connect junctures 68 and 76 to ground reference 70.

The second band pass filter circuit 44 includes a 34.7-milihenry inductor 80 connected in series with a 17.86 milihenry inductor 82 between input connectors 34 and 34' and output connector 50. Opposite sides of inductor 82 are coupled 93.13-microfarad capacitor 84 and a 32-microfarad capacitor 86. This provides a fixed output impedance at output connector 50 of sixteen ohms for connection via cable 48 to one or more 16-ohm bass speakers 46 especially adapted to provide good linear response to amplified low frequencies.

Figure 3:
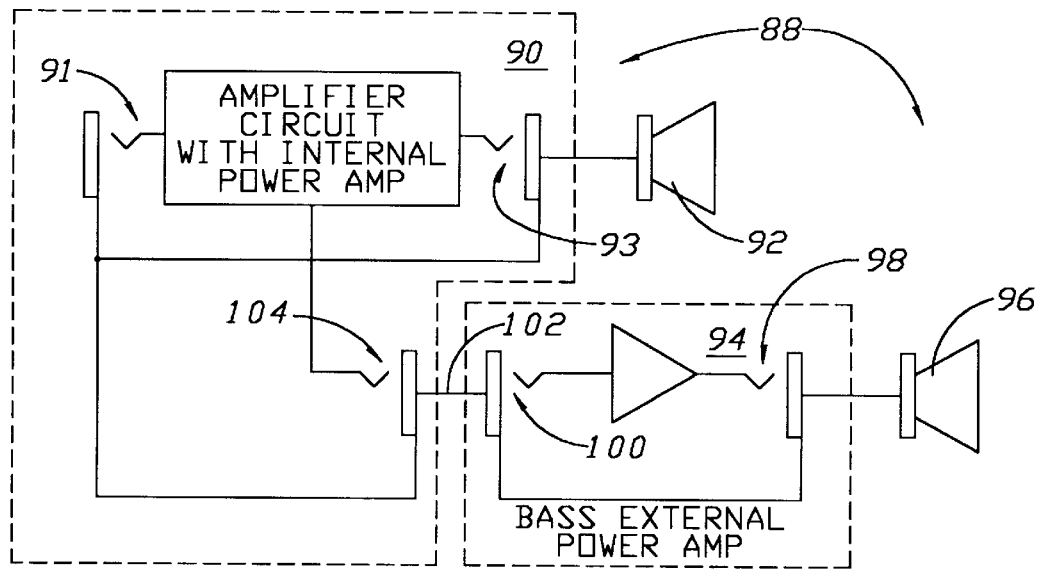
FIG. 3 is a partial schematic, partial functional block diagram of another form of the crossover circuit of the present invention which is partly internal to a base amplifier unit.

Referring now to FIG. 3, a schematic block diagram of another amplifying system 88 of the present invention with a crossover circuit is shown in which an amplifier system 90 has an amplifier system with internal power amplifier to amplify the relatively middle and high frequency signals at an input connector 91 and apply them to middle and high range speakers 92 through an output connector 93, only when an external power amplifier 94 connected with a bass speaker 96 through its output connector 98 has its input connector 100 connected through a cable 102 into a separate, special releasable jack receptacle connector 104 of the amplifier 90. When this releasable connection is made with connector 104, a switching circuit brings in a crossover circuit within the amplifier to separate out the relatively low frequency range signals before application to the input of an internal power amplifier and applies preamplified relatively low frequency range signals to the output connector 104 for power amplification by the especially adapted bass power amplifier 94 driving the especially adapted bass speaker 96. When the cable jack is not inserted into jack receptacle 104, the bass signals are not separated out but are applied along with all the other frequency signals to the input of the power amplifier within circuit 90, as shown in greater detail in the functional block diagram and the schematics of the preferred embodiment shown in FIGS. 4 and 5, respectively.

Figure 4:
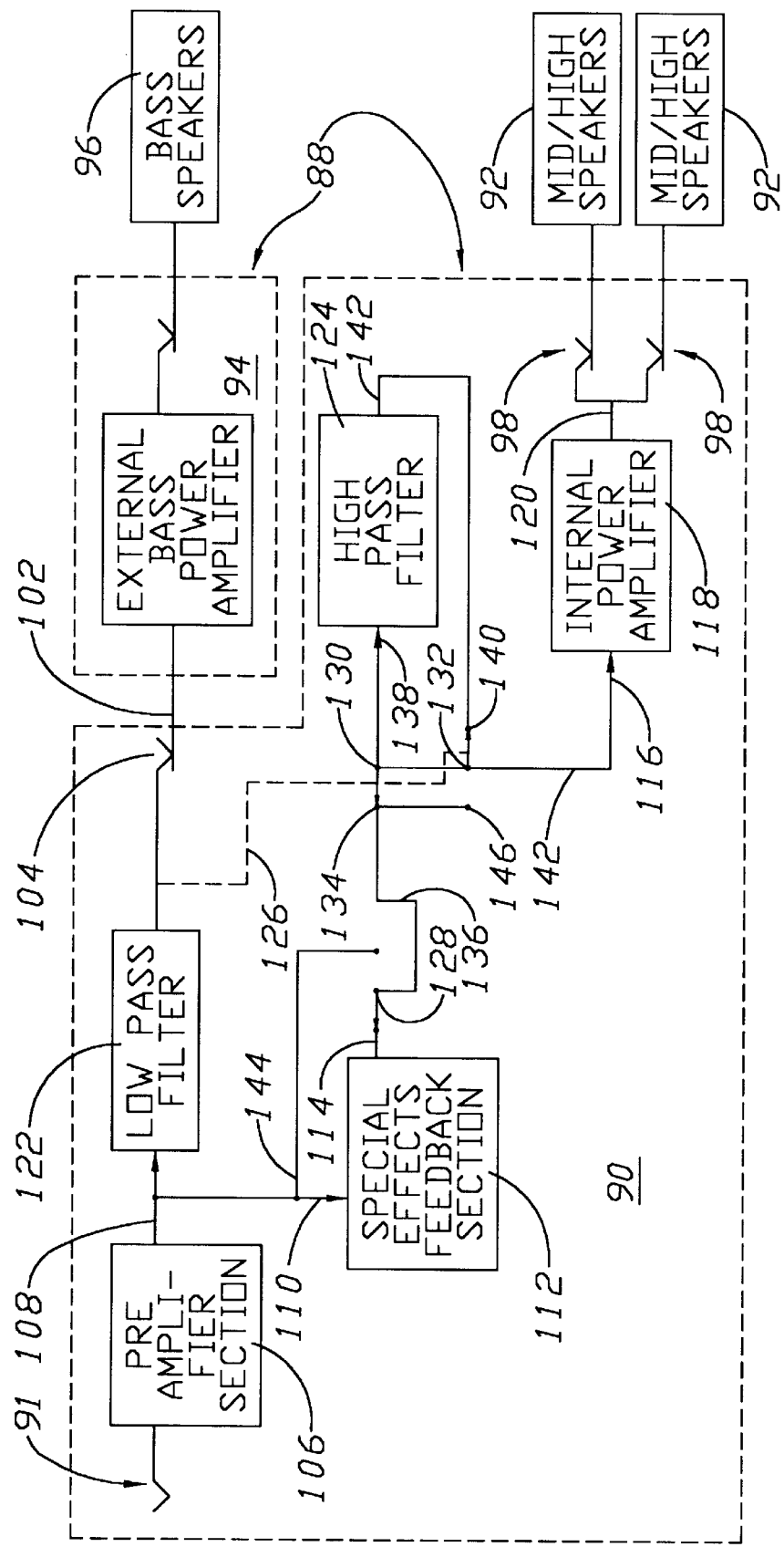
FIG. 4 is a functional block diagram of the preferred embodiment of the amplifier system with the internal crossover circuit of FIG. 3.

Referring first to FIG. 4, amplifier circuit 90 is seen to include a preamplifier section 106 having an input connected to input connector for receipt of the musical instrument signals and an output 108 connected to an input 110 of a special effects feedback section 112. An output 114 of special effects feedback section is, in turn, connectable with an input 116 of internal power amplifier 118. An output 120 of the internal power amplifier 118, in turn, is connected to one or more parallel cable jack receptacle connectors 98 connectable to one or more speakers 92. When the bass external amplifier 94 is connected through cable 102 to jack receptacle connector 104, the speakers 92 are preferably speakers that are especially adapted for good linear response to midrange and high range frequency signals. The bass, or low frequency, signals are applied only to the output connector 104 and not to the input 116 of the internal power amplifier 118 and, thus, the speakers 92 do not require a good broad band frequency response which includes the lowest frequencies. On the other hand, when the bass external power amplifier 94 is not connected with the amplifier circuit 90, the speaker 92 for best amplification are preferably broad band speaker systems or which include bass speakers, or "woofers". Broad band speakers, of course, can also be employed even when the bass external power amplifier is employed to drive the base speaker.

In accordance with the invention, the amplifier circuit 90 includes an internal crossover circuit which includes a low pass filter 122, a high pass filter 124, a switch 130 and a switch 132 which switch position in response to connection of cable 102 with connector 104 as indicated by broken line 126 to block the application of relatively low frequency signals to the internal power amplifier 118.

When a cable jack from the bass external power amplifier 94 is fully mounted into the back receptacle connector 104, the switches 130 and 132 are placed in the closed switch positions shown in FIG. 4. If a switch 128 is positioned to connect an output 114 of special effects feed back section 112 to a switch terminal 134 of switch 130 via line 136, then the processed signals on the output 114 of the special effects section 112 are passed through switch terminal 134 of switch 130 to input 138 of the high pass filter 124. If the switch 128, on the other hand, is in a position opposite to that shown, the special effects section 112 is bypassed and the unprocessed signals from the output 108 of the preamplifier section 106 is applied directly through lead 144 and switch 128 and switch 130 to input 138 of the high pass filter 124. However, in keeping with another aspect of the invention, the low pass filter 122 always receives only unprocessed signals directly from the preamplifier section 106, and the low pass filter 122 is always bypassed by the special effects section 112 regardless of the position of any of the switches. Advantageously, this enables selective amplification of special effects processed on only relatively middle and high frequency signals while leaving the bass signals unaltered.

Switch 132 is also responsive to connection of the bass external power amplifier 94 to the bass amplifier output connector 104 to be positioned in the position shown when the amplifier 94 is connected to connector 104, to connect the output 142 of the high pass filter 124 to the input 116 of the internal power amplifier 118. When the bass external power amplifier 94 is not being employed, the switch 132 is positioned to make connection with switch terminal 146 in order to bypass the high pass filter 124 and directly connect the full range of frequencies of the musical instrument signals appearing at switch 128 to the input 116 of the internal power amplifier 118.

Then, when the bass external power amplifier 94 is connected into the bass amplifier connector 104, the high pass filter 124 is switched into or interposed into series circuit between the preamplifier section 108 and the internal power amplifier 118 so that the internal power amplifier 118 only amplifies the manual internal signals in the relatively high frequency range. Preferably, speakers 92 are then selected which are respectively adapted for good higher frequency response, but, alternatively, the speakers regularly used to produce both relatively high and low frequency are used for speakers 92. The bass external power amplifier 94, on the other hand, receives only preamplified, relatively low frequency signals received from the output 104 of the low pass filter 122. Preferably, the bass external power amplifier 94 is especially adapted to have a good low frequency response at high power, and the bass speaker 96 is, of course, also selected for a good low frequency response at high power levels. Advantageously, because the input signals to the low pass filter 122 are taken directly from the preamplifier section, the special effects processing performed on the preamplified signals of relatively low frequency signals which are blocked by the high pass filter 124 are not passed to the internal power amplifier 118. Advantageously, this arrangement enables applying drive signals at relatively high frequencies to the speakers 92 with special effects components while simultaneously applying the relatively low frequency power drive signals to the bass speaker 96 which are without the special effects components. On the other hand, versatility of the amplifier 90 is also enhanced, for when high bass drive power is not required and the bass external power amplifier 94 is not employed, the special effects signal components produced by the special effects section 112 are amplified by the internal power amplifier 118 at all frequencies.

The preferred method of using the system of FIGS. 3–4, is that when it is not desired to play at high volume at bass frequencies or for any other reason, the bass external power amplifier 94 is not employed, the amplifier system 90 can be used as a stand alone unit in which the full frequency spectrum of manual internal signals is produced at its respective output connectors 98; the special effects processing components selectively produced by the special effects section 112 on all frequencies including the bass frequencies which otherwise would be blocked by the high pass filter 124 are produced at the output of the internal power amplifier for sound reproduction by regular speakers 92. On the other hand, when it is desired to perform at higher power output levels, particularly at bass frequencies, the connection of the bass external power amplifier 94 automatically causes the bass amplifier unit, or amplifier system 90, the bass unit 90 automatically switches to a special power bass mode in which the regular speakers 92 are driven solely by relatively high frequency signals. Maximum power is available at these relatively high frequencies in order to enhance the amplifier output in the range of frequencies at which the speakers are best adapted. Special effects are now selectively produced only at the regular speakers 92 with respect to only the signals in the relatively middle and high frequency ranges.

Referring now to FIG. 5, the low pass filter 122 is preferably an active 24 dbl octave active low pass active filter, preferably a model TL074 integrated circuit made by Texas Instruments Co. with a center frequency of 150 Hz. A potentiometer 148 controls the output level. The high pass filter 124 is also preferably a 24 dlb/octave high pass active filter, for which a model TL074 integrated circuit is also preferably employed. While active filters are preferred, it should be appreciated that passive filters could also be used.

The details of the special effects section 112 from no part of the invention, but it includes a pair of amplifiers 150 interconnected in a feed back loop to achieve different special effects such as digital delay, chorus, compressor and equalization. An "effects send" output connector 151 and an "effects return" output connector 153 enable connection to external equipment. The level is set by the position of a potentiometer 155, and the effects blend is set by potentiometers 156 and 158. The special effect signal processing is never performed on the bass signals from the low pass filter 122. Likewise, special effects on the bass signals are selectively not produced by the internal power amplifier 118 when the bass external amplifier is connected for base signal amplification.

While a preferred specific embodiment has been disclosed, it should be appreciated that many variations can be made thereto without departing from the scope of the invention as set forth in the appended claims. For instance, although certain frequencies have been indicated, it should be appreciated that at least some of the aspects of the invention are applicable with other frequencies, and also that the concepts of the invention can be implemented with other filters and circuit arrangements than those shown and described with respect to the preferred embodiment.

I claim:

1. A method of selectively amplifying musical instrument signals comprising the steps of:

producing power amplified signals of signals of all frequencies on a speaker output connector of a base unit amplifier;

when normal operation is desired, selectively connecting the speaker output connector to a regular speaker to reproduce the amplified musical instrument signals of all frequencies; and when large bass frequency amplification is desired, selectively connecting the output connector to a crossover circuit to separate the power amplified musical instrument signals into relatively low and relatively high frequency signals components, connecting the relatively low frequency component signal to a bass speaker especially adapted to reproduce relatively low frequency signals, and connecting the relatively high frequency component signal to another speaker.

2. The method of claim 1 in which the other speaker is the regular speaker.

3. The method of claim 1 in which said crossover circuit performs the step of separating the power amplified signals into relatively low and relatively high frequency components by means of passive filter circuits.

4. In a musical instrument amplifying system having an internal power amplifier circuit with an input and an output, an input connector for releasable connection with an output cable of the musical instrument carrying musical instrument signals having different frequencies, and an output terminal for connection of the output of the internal power amplifier with an audio speaker, the improvement being a frequency selective crossover circuit, comprising:

a special output terminal;

means selectively blocking from the input of the internal power amplifier circuit musical instrument signals of only a preselected frequency range, the musical instrument signals of frequency outside said preselected frequency range being provided to the internal power amplifier for amplification; and means for passing to the special output terminal, musical instrument signals of another frequency range within the preselected range blocked from the input of the internal amplifier by said selective blocking means.

5. The musical instrument amplifying system of claim 4 in which the other frequency range of the signals applied to the special output terminal is substantially the same frequency range as the one preselected frequency range blocked by said blocking means.

6. The musical instrument amplifying system of claim 4 in which the other frequency range of the musical instrument signals applied to the special output terminal include relatively low bass frequencies.

7. The musical instrument amplifying system of claim 6 in which the preselected frequency range of the musical instrument signals which are blocked are relatively low frequencies.

8. The musical instrument amplifying system of claim 4 in which the preselected frequency range of the musical instrument signals which are blocked are the relatively low bass frequencies.

9. The musical instrument amplifying system of claim 4 including
  a special effects circuit for imposing special effects signal processing on the musical instruments signals from the input connector; and
  means for interposing the selective blocking means between the special effects circuit and the input of the internal power amplifier to block from the internal power amplifier special effects processed signals in the frequency range that is blocked while allowing special effects processed signals outside of the blocked frequency ranges to be amplified by the internal power amplifier.

10. The musical instrument amplifying system of claim 9 including means for bypassing the special effect circuit with the musical instrument signals passed to the special output terminal to enable power amplification of special effect processed signals only if they are passed to the input of the internal power amplifier.

11. The musical instrument amplifying system of claim 4 in which said selective blocking means includes
  means for filtering out musical instrument signals while outside of the other frequency range which is passed to the input of the internal amplifier, and
  means for selectively switching the filtering means into circuit with the internal amplifier.

12. The musical instrument amplifying system of claim 11 in which said selective switching means includes means responsive to the making a cable connection with the special output terminal for automatically switching the filtering means into circuit to block the musical instrument signals in the preselected frequency range from being applied to the internal power amplifier.

13. The musical instrument amplifying system of claim 12 in which the special output terminal is a jack receptacle with a tip connector which moves when engaged by a male jack connector and said selective switching means includes means responsive to movement of said tip connector.

14. The musical instrument amplifying system of claim 4 in which the means for passing includes
  a low pass filter for passing signals in a relatively low frequency range to the special output terminal, and
  means for connecting the low pass filter between the input terminal and the special output terminal.

15. The musical instrument amplifying system of claim 14 in combination with
  an acoustic speaker, and
  an external power amplifier with an input connected to the special output terminal and an output connected to the acoustic speaker.

16. The musical instrument amplifying system of claim 15 in which the acoustic speaker is especially adapted for a good linear response to relative low frequency signals.

17. The musical instrument amplifying system of claim 15 in which said external power amplifier has means for adjusting its output power to the acoustic speaker.

18. A method of selectively amplifying musical instrument signals comprising the steps of:
  employing a base amplifier unit with an internal power amplifier for amplifying musical instrument signals of the full frequency range at a regular speaker output connector and for producing preamplified musical instrument signals of only a preselected frequency range at a special output connector;
  connecting an external power amplifier to the special output connector for power amplifying the preamplified musical instrument signals of the only preselected frequency range; and
  selectively blocking musical instrument signals within the preselected frequency range from being amplified by the internal power amplifier.

19. The method of claim 18 in which said step of selective blocking includes the step of selectively blocking automatically in response to connection of the external power amplifier to the special output terminal.

20. The method of claim 18 in which said step of blocking is only selectively performed when the external power amplifier is connected to the special output connector.

21. The method of claim 18 in which said preselected frequency range includes the relatively low frequencies and including the steps of
  using the external power amplifier to drive a bass speaker especially adapted for producing signals in the preselected low frequencies, and
  using regular broad band speakers to reproduce relatively higher frequency musical instrument signals from the internal power amplifier.

\* \* \* \* \*